United States Patent
Roth

(10) Patent No.: US 8,854,063 B2
(45) Date of Patent: Oct. 7, 2014

(54) METHOD AND APPARATUS FOR DETERMINING A CAPACITANCE AND/OR CHANGE IN CAPACITANCE OF A CAPACITIVE SENSOR ELEMENT

(75) Inventor: Bernhard Roth, Bielefeld (DE)

(73) Assignee: E.G.O. Elektro-Gerätebau GmbH, Oberderdingen (DE)

( * ) Notice: Subject to any disclaimer, the term of this patent is extended or adjusted under 35 U.S.C. 154(b) by 433 days.

(21) Appl. No.: 13/271,900

(22) Filed: Oct. 12, 2011

(65) Prior Publication Data

US 2012/0092030 A1    Apr. 19, 2012

(30) Foreign Application Priority Data

Oct. 14, 2010  (DE) .......................... 10 2010 042 477

(51) Int. Cl.
G01R 27/26 (2006.01)
H03K 17/955 (2006.01)

(52) U.S. Cl.
CPC .. *H03K 17/955* (2013.01); *H03K 2217/960725* (2013.01)
USPC ............ 324/679; 324/678; 324/687; 324/686

(58) Field of Classification Search
CPC ......... G01R 17/06; G01R 17/00; G01R 17/04
USPC .......................................................... 324/679
See application file for complete search history.

(56) References Cited

U.S. PATENT DOCUMENTS

| | | | |
|---|---|---|---|
| 4,187,460 A * | 2/1980 | Dauge et al. ............... | 324/678 |
| 4,459,541 A * | 7/1984 | Fielden et al. .............. | 324/678 |
| 5,576,628 A * | 11/1996 | Caliboso et al. ............ | 324/678 |
| 6,262,589 B1 | 7/2001 | Tamukai | |
| 6,756,792 B2 * | 6/2004 | Armbruster ................ | 324/687 |
| 7,078,918 B2 * | 7/2006 | Umeda et al. .............. | 324/679 |
| 7,098,638 B1 * | 8/2006 | Herbert ....................... | 323/282 |

(Continued)

FOREIGN PATENT DOCUMENTS

| | | |
|---|---|---|
| EP | 1 339 025 A1 | 8/2003 |
| FR | 2 938 344 A1 | 5/2010 |

OTHER PUBLICATIONS

German Office Action dated Jun. 7, 2011 in German Application No. 10 2010 042 477.3.

(Continued)

*Primary Examiner* — Jermele M Hollington
*Assistant Examiner* — Christopher McAndrew
(74) *Attorney, Agent, or Firm* — Hope Baldauff, LLC

(57) ABSTRACT

A method for determining a capacitance and/or a change in capacitance of a capacitive sensor element (C2) comprises the steps of: a) discharging an average value capacitor (C3), and either b1) discharging the capacitive sensor element and c1) charging an operating capacitor (C1) to a charging voltage (VDD), or b2) discharging the operating capacitor and c2) charging the capacitive sensor element to the charging voltage, d) connecting the operating capacitor to the capacitive sensor element, e) connecting the operating capacitor to the average value capacitor, and f) evaluating a voltage established across the operating capacitor or across the average value capacitor in order to determine the capacitance and/or the change in capacitance.

10 Claims, 2 Drawing Sheets

(56) References Cited

U.S. PATENT DOCUMENTS

| | | | |
|---|---|---|---|
| 7,109,727 B2 * | 9/2006 | Hayakawa et al. | 324/679 |
| 7,403,020 B2 * | 7/2008 | Braun et al. | 324/678 |
| 7,683,641 B2 * | 3/2010 | Hargreaves et al. | 324/686 |
| 2007/0046299 A1 | 3/2007 | Hargreaves et al. | |
| 2009/0295409 A1 * | 12/2009 | Irkliy | 324/658 |
| 2010/0181180 A1 | 7/2010 | Peter | |
| 2010/0283485 A1 | 11/2010 | Välisuo et al. | |
| 2011/0210753 A1 | 9/2011 | Hourne | |

OTHER PUBLICATIONS

Cypress Perform PSoC® CY8C20x66, CY8C20x66A, CY8C20x46/96, CY8C20x46A/96A, CY8C20x36, CY8C20x36A Technical Reference Manual (TRM) Document No. 001-22219 Rev. D, Cypress Semiconductor, Jul. 24, 2009, 14 pps.

European Search Report dated Feb. 5, 2014 in European Application No. Ep 11 18 4795.

Thomas Perme et al., "Capacitive Touch Using Only an ADC ("CVD")", AN1298, 2009 Microchip Technology, Inc.; pp. 4.

* cited by examiner

METHOD AND APPARATUS FOR DETERMINING A CAPACITANCE AND/OR CHANGE IN CAPACITANCE OF A CAPACITIVE SENSOR ELEMENT

CROSS REFERENCE TO RELATED APPLICATIONS

This application claims priority to German patent application DE 10 2010 042 477.3, filed on Oct. 14, 2010, the contents of which are incorporated by reference for all that it teaches.

FIELD OF APPLICATION

The invention relates to a method and an apparatus for determining a capacitance and/or a change in capacitance of a capacitive sensor element.

BACKGROUND

U.S. patent application 2010/0181180 A1 shows a method and an apparatus for determining a capacitance and/or a change in capacitance of a capacitive sensor element, in which an internal capacitor of a microprocessor is used to measure the capacitance. In this case, the internal capacitor is first of all charged and the capacitive sensor element is discharged. The internal capacitor and the capacitive sensor element are then connected to one another, the voltage established across the internal capacitor being evaluated in order to determine the capacitance and/or the change in capacitance. Alternatively, the internal capacitor is first of all discharged and the capacitive sensor element is charged.

SUMMARY

One embodiment of the invention is based on the problem of providing a method and an apparatus for determining a capacitance and/or a change in capacitance of a capacitive sensor element, which method and apparatus make it possible to reliably determine the capacitance and/or the change in capacitance.

The invention addresses this problem in one embodiment by means of a method as claimed herein. The claims relate to preferred embodiments, the wording of which claims is hereby incorporated by reference in the content of the description.

The method for determining a capacitance and/or a change in capacitance of a capacitive sensor element in one embodiment, that is to say a capacitor with an unknown capacitance, the capacitance of which changes in a touch-dependent manner for example, comprises the steps of: a) discharging an average value capacitor with a known or unknown capacitance, and either b1) discharging the capacitive sensor element and c1) charging an operating capacitor with a known or unknown capacitance to a known or unknown charging voltage which is, however, substantially constant over time, or b2) discharging the operating capacitor and c2) charging the capacitive sensor element to the charging voltage, d) connecting the operating capacitor to the capacitive sensor element, e) connecting the operating capacitor to the average value capacitor, in which case the operating capacitor is disconnected from the capacitive sensor element beforehand and the operating capacitor is then disconnected from the average value capacitor before carrying out step b1) or b2) again, and f) evaluating a voltage established across the operating capacitor or across the average value capacitor in order to determine the capacitance and/or the change in capacitance.

The steps described above preferably form an individual measuring cycle, the measuring cycle preferably being cyclically repeated in order to determine further measured values. Said steps are preferably carried out in succession in the stated order. When the charging voltage is unknown and when the capacitance of the reference and/or average value capacitor is unknown, the voltage established across the operating capacitor or across the average value capacitor can be monitored for a change, for example, by comparing the currently measured voltage with a voltage from a previous measuring cycle or a plurality of previous measuring cycles. When the voltage is known and when the capacitances are known, the capacitance of the sensor element can be determined, for example computationally, using the voltage which is established.

In one embodiment, before step f), steps b1) and c1) or b2) and c2) to e) are repeated a predefined number of times, in particular a number of times which is constant over time, for example five to fifteen times, the voltage established across the operating capacitor or across the average value capacitor being evaluated after the repetition in order to determine the capacitance and/or the change in capacitance. Alternatively, steps b1) and c1) or b2) and c2) to f) are repeated until a predefined threshold voltage is established across the operating capacitor or across the average value capacitor in step f) when evaluating the voltage established across the operating capacitor or across the average value capacitor, a number of the repetitions additionally being evaluated in order to determine the capacitance and/or the change in capacitance. The capacitance and/or the change in capacitance can be determined from the required number of repetitions in conjunction with the predefined voltage.

In one embodiment, the charging voltage is known. The capacitance of the operating capacitor and/or the capacitance of the average value capacitor is/are preferably known.

In one embodiment, the method is carried out using a microprocessor, the microprocessor comprising: an internal capacitor which forms the operating capacitor, an A/D converter which is connected to the internal capacitor, a first port, a second port, and a third port. Each of the ports can be configured as an input or as an output, the capacitive sensor element being connected to the second port, and the average value capacitor being connected to the third port, and a multiplexer which is connected, on the input side, to the ports and is connected, on the output side, to the internal capacitor and connects one of the ports to the internal capacitor. The method also comprises the following steps which are carried out in succession: g) configuring the third port as an output and outputting a low signal at the third port, h) configuring the third port as an input, i) configuring the first port as an output and outputting a high signal at the first port, j) configuring the second port as an output and outputting a low signal at the second port, k) configuring the second port as an input, l) setting the multiplexer in such a manner that the internal capacitor is connected to the first port, m) setting the multiplexer in such a manner that the internal capacitor is connected to the second port, n) setting the multiplexer in such a manner that the internal capacitor is connected to the third port, o) digitizing the voltage present across the internal capacitor into a digital voltage value using the A/D converter, and p) evaluating the digitized voltage value in order to determine the capacitance and/or the change in capacitance.

Steps j) to n) are preferably repeated a predefined number of times before step o). Alternatively, steps j) to p) are repeated until a predefined digitized threshold voltage value is established in step p), a number of the repetitions additionally being evaluated in order to determine the capacitance and/or the change in capacitance.

An apparatus for determining a capacitance and/or a change in capacitance of a capacitive sensor element is designed to carry out the abovementioned method and comprises: an average value capacitor, an operating capacitor, means for discharging the average value capacitor, means for discharging the capacitive sensor element and/or charging the capacitive sensor element to a charging voltage, means for discharging the operating capacitor and/or charging the operating capacitor to the charging voltage, means for connecting the operating capacitor to the capacitive sensor element, means for connecting the operating capacitor to the average value capacitor, and means for evaluating a voltage which is established across the operating capacitor or across the average value capacitor in order to determine the capacitance and/or the change in capacitance.

In one embodiment, the apparatus comprises a microprocessor comprising an internal capacitor which forms the operating capacitor, an A/D converter which is connected to the internal capacitor, a first port, a second port, and a third port. Each port can be configured as an input or as an output, the capacitive sensor element being connected to the second port, and the average value capacitor being connected to the third port, a multiplexer which is connected, on the input side, to the ports and is connected, on the output side, to the internal capacitor and connects one of the ports to the internal capacitor, and a program memory for storing program code, during the execution of which the method is carried out.

BRIEF DESCRIPTION OF THE DRAWINGS

Advantageous embodiments of the invention are schematically illustrated in the drawings and are described below. In this case.

DETAILED DESCRIPTION

Figure 1:
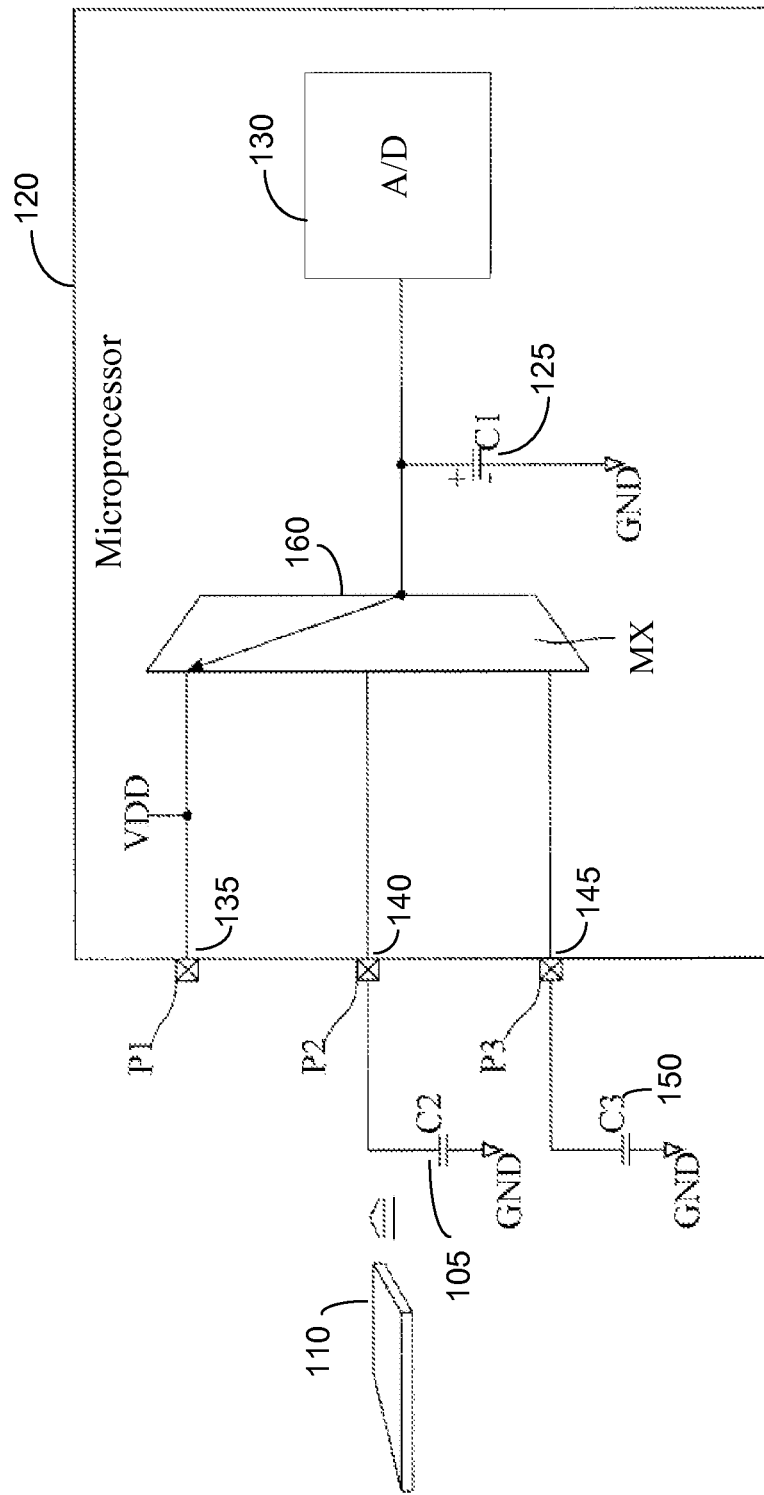
FIG. 1 shows a block diagram of a first embodiment of an apparatus for determining a capacitance and/or a change in capacitance of a capacitive sensor element.

FIG. 1 schematically shows a block diagram of a first embodiment of an apparatus for determining a capacitance and/or a change in capacitance of a capacitive sensor element 105 ("C2"), for example in the form of a capacitive button 110, the capacitance of which changes in a touch-dependent manner. The capacitive sensor element C2 is illustrated using its electrical equivalent circuit diagram.

The apparatus comprises a microprocessor 120 ("MP") having an internal capacitor 125 ("C1") which has a known capacitance and forms an operating capacitor, an A/D converter 130 ("AD") which is connected to the operating capacitor, a first port 135 ("P1"), a second port 140 ("P2") and a third port 145 ("P3"), each of which can be configured as an input or as an output, the capacitive sensor element C2 being connected to the second port P2 and the average value capacitor 150 ("C3") being connected to the third port P3, a multiplexer 160 ("MX") which is connected, on the input side, to the ports P1 to P3 and is connected, on the output side, to the operating capacitor C1 and connects one of the ports to the internal capacitor, and a program memory (not illustrated in detail) for storing program code, during the execution of which the method according to one embodiment of the invention is carried out.

In order to determine the capacitance and/or the change in capacitance of the capacitive sensor element C2, the following steps are carried out in succession:

In a step 1), the first port P1 is first configured as an output and a high signal is output at the first port P1, that is to say a supply voltage VDD of the microprocessor MP is present at the port P1.

In a step 2), the third port P3 is then configured as an output and a low signal is output at the third port P3, as a result of which the average value capacitor C3 is discharged at the beginning of a measurement.

In a step 3), the third port P3 is then configured as an input in order to make it possible to gradually charge the average value capacitor C3.

In a step 4), the second port P2 is now configured as an output and a low signal is output at the second port P2, as a result of which the capacitive sensor element C2 is discharged.

In a step 5), the second port P2 is then configured as an input in order to make it possible to charge the sensor element C2.

In a step 6), the multiplexer MX is now set in such a manner that the internal capacitor or the operating capacitor C1 is connected to the first port P1, as a result of which the internal capacitor C1 is charged to the voltage VDD as the charging voltage.

In a step 7), the multiplexer MX is then set in such a manner that the internal capacitor C1 is connected to the second port P2 and thus to the capacitive sensor element C2. Charge equalization now takes place between the capacitors C1 and C2, that is to say the internal capacitor C1 is discharged to a residual charge.

Equation (1) applies to the voltage ("US7") across the internal capacitor C1 after step 7):

$$US7 = C1 * VDD/(C1+C2) \qquad \text{Eq. (1)}$$

In a step 8), the multiplexer MX is now set in such a manner that the internal capacitor C1 is connected to the third port P3 and thus to the average value capacitor C3, as a result of which part of the residual charge of the internal capacitor C1 is transferred to the average value capacitor C3.

In a step 9), steps 4 to 8 are now repeated n times, for example where 4>n>25, as a result of which, in a rough approximation, the following voltage ("US8") shown in Equation (2) is established across the internal capacitor C1 and across the average value capacitor C3 after step 8):

$$US8 = C1 * US7 * n/(C1+C3) \qquad \text{Eq. (2)}$$

In this case, it may be simplistically assumed that the average value capacitor C3 is charged in a linear manner in the range considered.

In a step 10), the voltage US8 is converted into a digital voltage value using the A/D converter AD and is evaluated, in a step 11), in order to determine the capacitance and/or the change in capacitance of the capacitive sensor element C2.

Said steps form a measuring cycle, steps 2) to 11) being repeated in successive measuring cycles.

If the values of the voltage VDD and the capacitance values of the capacitors C1 and C3 are known, the capacitance of the capacitor C2 can be calculated and an activation state of the capacitive sensor element C2 can thus be determined. If the values are not known, a change in the activation state can be inferred by forming the difference between measured values from successive measuring cycles.

Instead of repeating steps 4 to 8 a predefined number of times, in particular a constant number of times, in step 9, steps 4 to 8 and 10 and 11 can alternatively be repeated until a predefined digitized threshold voltage value is established, the number of the repetitions being evaluated in order to determine the capacitance and/or the change in capacitance.

Figure 2:
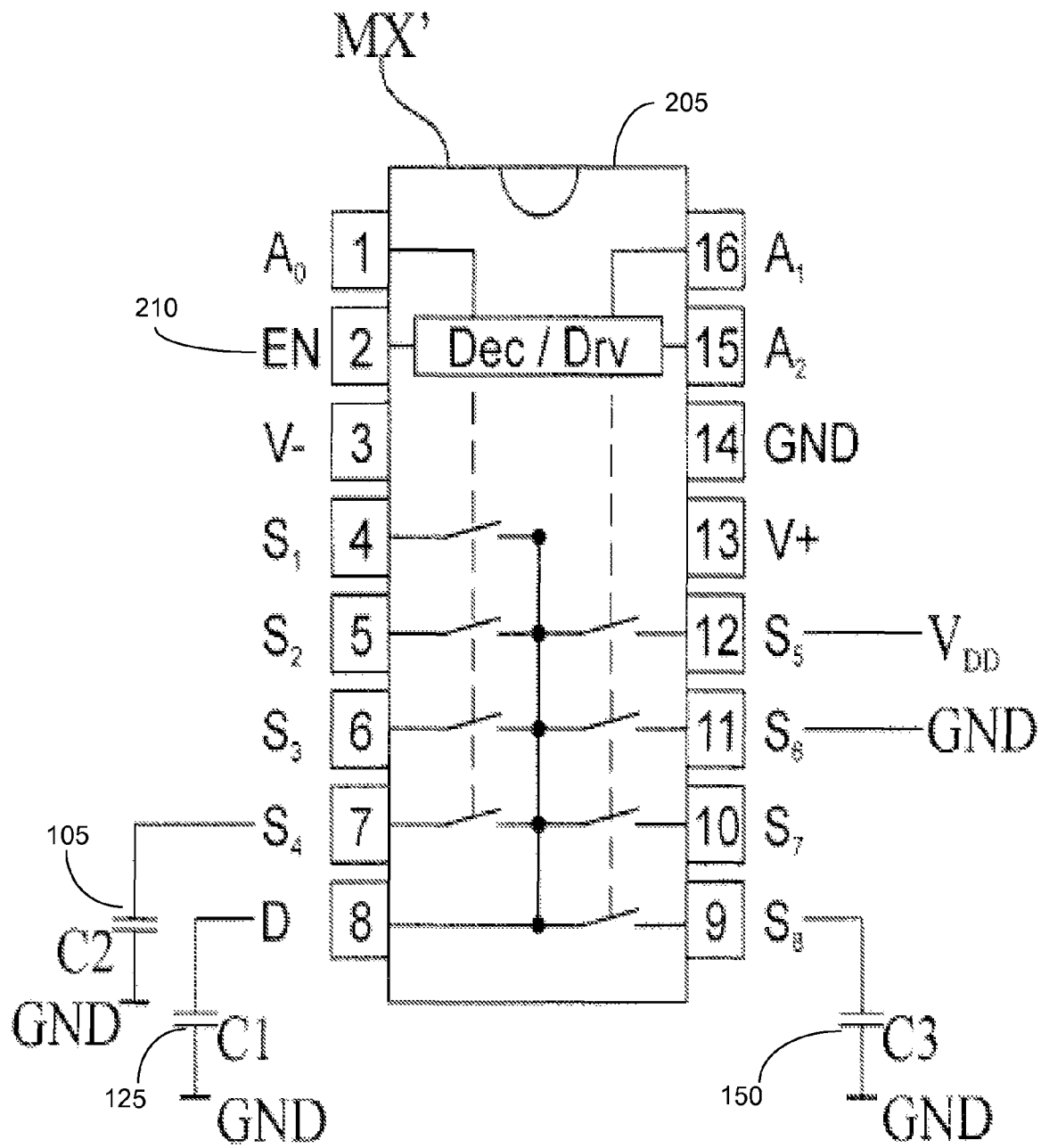
FIG. 2 shows a block diagram of another embodiment of an apparatus for determining a capacitance and/or a change in capacitance of a capacitive sensor element.

FIG. 2 shows a block diagram of another embodiment of an apparatus for determining a capacitance and/or a change in capacitance of a capacitive sensor element, in which the previously described internal multiplexer MX and the internal capacitor C1 are in the form of discrete components.

A multiplexer 205 ("MX'"), for example of the type DG508B, connects one of the inputs S1 to S8 to a common output D depending on the state of signals at address inputs A0 to A2. The address inputs A0 to A2 are connected to ports of a microprocessor (not shown) which drives them in a suitable manner. The average value capacitor 150 C3 is connected to the input S8 of the multiplexer MX' and to a port (not shown) of the microprocessor, the port being able to be configured as an (analogue) input and as an output. VDD is connected to the input S5 and GND is connected to the input S6.

Yet further capacitive sensor elements (not shown) may be connected to the inputs S1 to S3 and S7.

The circuit shown in FIG. 2 may be driven or operated as described below.

An EN control 210 line is first of all set to "1". The EN control line may remain set or may be briefly reset between the individual method steps in order to ensure clear switching states.

In order to charge the operating capacitor C1 125 to VDD, the address inputs A0 to A2 are set in such a manner that the switch associated with the input S5 is closed.

In order to transfer charge from C1 125 to C2 105, the address inputs A0 to A2 are set in such a manner that the switch associated with the input S4 is closed.

In order to transfer residual charge from C1 to C3, the address inputs A0 to A2 are set in such a manner that the switch associated with the input S8 is closed.

The capacitive sensor element C2 can now be discharged, for example, by the capacitive sensor element C2 also being additionally connected to a microprocessor port which, for the purpose of discharging, is configured as an output at which a low signal is output. Alternatively, gradual discharging can be carried out using the operating capacitor C1 which is first of all discharged by being connected to GND by closing the switch associated with the input S6 and is then connected to the capacitive sensor element C2 in order to discharge the latter.

After the capacitive sensor element C2 has been discharged, the abovementioned steps are repeated a number of times. The voltage across the capacitor C3 is then measured using an AD converter of the microprocessor, which voltage is then evaluated in order to determine the capacitance.

The average value capacitor C3 can then be discharged by configuring the associated microprocessor port as an output and outputting a low signal.

The abovementioned steps can then be repeated for all capacitive sensor elements.

In the embodiments shown, the capacitive sensor element is discharged and the operating capacitor is charged to the charging voltage before the capacitive sensor element is connected to the operating capacitor. The capacitive sensor element can also be alternatively first of all charged to the charging voltage and the operating capacitor can be discharged.

The embodiments shown make it possible to determine a capacitance and/or a change in capacitance of a capacitive sensor element in a reliable and interference-free manner.

The invention claimed is:

1. A method that determines one of a capacitance or a change in capacitance of a capacitive sensor element, the method comprising:
    a) discharging an average value capacitor;
    one of
       b1) discharging the capacitive sensor element and
       c1) charging an operating capacitor to a charging voltage,
    or
       b2) discharging the operating capacitor and
       c2) charging the capacitive sensor element to the charging voltage;
    d) connecting the operating capacitor to the capacitive sensor element;
    e) connecting the operating capacitor to the average value capacitor;
    f) evaluating a voltage established one of across the operating capacitor or across the average value capacitor in order to determine one of the capacitance or the change in capacitance,
    wherein the method is further carried out using a microprocessor, the microprocessor comprising
       an internal capacitor which forms the operating capacitor,
       an A/D converter which is connected to the internal capacitor,
       a plurality of ports including a first port, a second port and a third port, each of the plurality of ports capable of being configured as one of an input or an output, the capacitive sensor element being connected to the second port, and the average value capacitor being connected to the third port, and
       a multiplexer which is connected, on the input side, to the plurality of ports and is connected, on the output side, to the internal capacitor,
    wherein the microprocessor being configured to further perform the method comprising the following steps in succession,
    g) configuring the first port as an output and outputting a high signal at the first port;
    h) configuring the third port as an output and outputting a low signal at the third port;
    i) configuring the third port as an input;
    j) configuring the second port as an output and outputting a low signal at the second port;
    k) configuring the second port as an input;
    l) setting the multiplexer in such a manner that the internal capacitor is connected to the first port;
    m) setting the multiplexer such that the internal capacitor is connected to the second port;
    n) setting the multiplexer such that the internal capacitor is connected to the third port;
    o) digitizing a voltage present across the internal capacitor into a digital voltage value using the A/D converter; and
    p) evaluating the digitized voltage value in order to determine one of the capacitance or the change in capacitance.

2. The method according to claim 1, wherein before step f), one of steps b1) and c1), or steps b2) and c2) to step e) are repeated a predefined number of times.

3. The method according to claim 1, wherein one of steps b1) and c1), or steps b2) and c2) to step f) are repeated until a predefined threshold voltage is established one of across the operating capacitor or across the average value capacitor in step f), a number of the repetitions additionally being evaluated in order to determine one of the capacitance or the change in capacitance.

4. The method according to claim 1, wherein the charging voltage is known.

5. The method according to claim 1, wherein at least one of the capacitance of the operating capacitor or the capacitance of the average value capacitor is known.

6. The method according to claim 1, wherein before step o), steps j) to step n) are repeated a predefined number of times.

7. The method according to claim 1, wherein steps j) to step p) are repeated until a predefined digitized threshold voltage value is established in step p), a number of the repetitions additionally being evaluated in order to determine one of the capacitance or the change in capacitance.

8. A method for determining one of a capacitance or a change in capacitance of a capacitive sensor element, wherein the method is carried out using a microprocessor including
    an internal capacitor which forms an operating capacitor,
    an A/D converter which is connected to the internal capacitor,
    a plurality of ports including a first port, a second port and a third port, each of the plurality of ports capable of being configured as an input or as an output, the capacitive sensor element being connected to the second port, and an average value capacitor being connected to the third port, and
    a multiplexer which is connected, on the input side, to the plurality of ports and is connected, on the output side, to the internal capacitor,
    the microprocessor being configured to perform the method according to the following steps in succession comprising:
    a) configuring the first port as an output and outputting a high signal at the first port;
    b) configuring the third port as an output and outputting a low signal at the third port;
    c) configuring the third port as an input;
    d) configuring the second port as an output and outputting a low signal at the second port;
    e) configuring the second port as an input;
    f) setting the multiplexer such manner that the internal capacitor is connected to the first port;
    g) setting the multiplexer such that the internal capacitor is connected to the second port;
    h) setting the multiplexer such manner that the internal capacitor is connected to the third port;
    i) digitizing a voltage present across the internal capacitor into a digital voltage value using the A/D converter; and
    j) evaluating the digitized voltage value in order to determine one of the capacitance or the change in capacitance.

9. The method according to claim 8, wherein before step i), steps d) to step h) are repeated a predefined number of times.

10. The method according to claim 8, wherein steps d) to step j) are repeated until a predefined digitized threshold voltage value is established in step j), a number of the repetitions additionally being evaluated in order to determine one of the capacitance or the change in capacitance.

* * * * *